United States Patent [19]
Shodo

[11] Patent Number: 5,973,314
[45] Date of Patent: Oct. 26, 1999

[54] PHOTOELECTRIC CONVERTING DEVICE WHICH PREVENTS POWER SOURCE RIPPLE FROM MIXING INTO AN OUTPUT SIGNAL

[75] Inventor: Kenzo Shodo, Kyoto, Japan

[73] Assignee: Rohm Co., Ltd., Kyoto, Japan

[21] Appl. No.: 08/998,896

[22] Filed: Dec. 29, 1997

[30]     Foreign Application Priority Data

Dec. 27, 1996   [JP]   Japan ................................. 8-350439

[51] Int. Cl.$^6$ ........................................ H01J 40/14

[52] U.S. Cl. ................... 250/214 R; 250/214 A; 250/214.1; 257/461

[58] Field of Search ........................... 250/214 R, 214 A, 250/214 LA, 214.1; 330/59, 110, 308; 257/431, 461; 327/514

[56]               References Cited

U.S. PATENT DOCUMENTS 3,872,329   3/1975   Dodson, III .......................... 250/214 R
4,314,152   2/1982   Fenk ..................................... 250/214 R

*Primary Examiner*—Edward P. Westin
*Assistant Examiner*—Kevin Pyo
*Attorney, Agent, or Firm*—Nikaido, Marmelstein, Murray & Oram LLP

[57]               ABSTRACT

A photo diode is connected to an input terminal of an amplifier to which a feedback resistor is connected. An output current of this photo diode flows from the output terminal side of the amplifier through the feedback resistor. The output of the photo diode converted into a voltage is given to the output terminal side of the amplifier. The feedback resistor is formed by a P-type resistor region provided in an N-type resistor land of a semiconductor substrate. In order to apply an inverse bias to the PN junction between the resistor land and resistor region, the resistor land is connected to the output terminal of the amplifier.

6 Claims, 5 Drawing Sheets

PHOTOELECTRIC CONVERTING DEVICE WHICH PREVENTS POWER SOURCE RIPPLE FROM MIXING INTO AN OUTPUT SIGNAL

BACKGROUND OF THE INVENTION

1. Field of the Invention

The present invention relates to a photoelectric converting device for converting an output current of a photoelectric converter such as photo diode into a voltage.

2. Description of the Prior Art

A photoelectric converting device is used, for example, in a photo detector of an optical pickup apparatus installed in a compact disk player. In the photoelectric converting device, a photo diode is connected to an input terminal of an amplifier to which a feedback resistor is connected, and the output current of this photo diode is converted into a voltage, and the converted voltage is obtained from the outside of the amplifier. When composing such photoelectric converting device by an integrated circuit, the feedback resistor is provided in the semiconductor integrated circuit device. When a resistor is formed in a region for a resistor formation use (hereinafter referred as to "resistor land") in the semiconductor substrate, an inverse bias is applied to the PN junction which is formed between the resistor region and the resistor land so that the PN junction may not conduct. Conventionally, to realize this inverse bias, the resistor land was connected to the power source line, that is, the power source line of the amplifier.

By applying an inverse bias to the PN junction between the resistor region and resistor land, a stray capacitor occurs in the PN junction portion. Therefore, when a power source voltage is applied to the resistor land, ripple caused by fluctuation of the power source voltage due to operating condition of other circuits or the like connected to the power source line may mix into the output of the photoelectric converting device through the stray capacitor.

SUMMARY OF THE INVENTION

It is an object of the invention to present a photoelectric converting device capable of preventing power source ripple from mixing into the output.

The photoelectric converting device of the invention comprises an amplifier, photoelectric converting means connected between an input terminal of the amplifier and a grounding voltage point, a feedback resistor connected between the input terminal of the amplifier and an output terminal through which the current of photoelectric converting means flows, this feedback resistor being formed by P-type resistor region provided in an N-type resistor land of a semiconductor substrate, and means for connecting the resistor land to an output terminal of the amplifier in order to apply an inverse bias to the PN junction between the resistor land and resistor region.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 1:
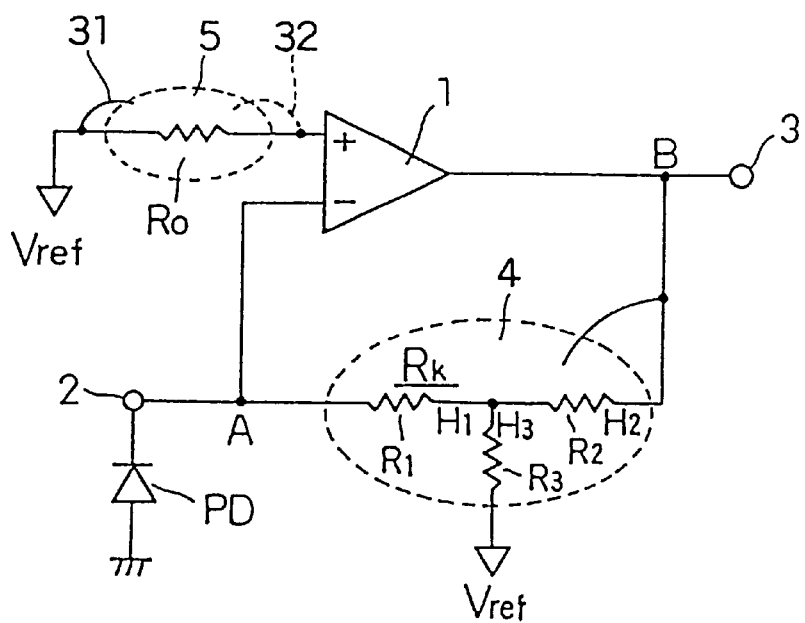
FIG. 1 is a drawing showing a circuit configuration of a photoelectric converting device in a first embodiment of the invention.
Figure 2:
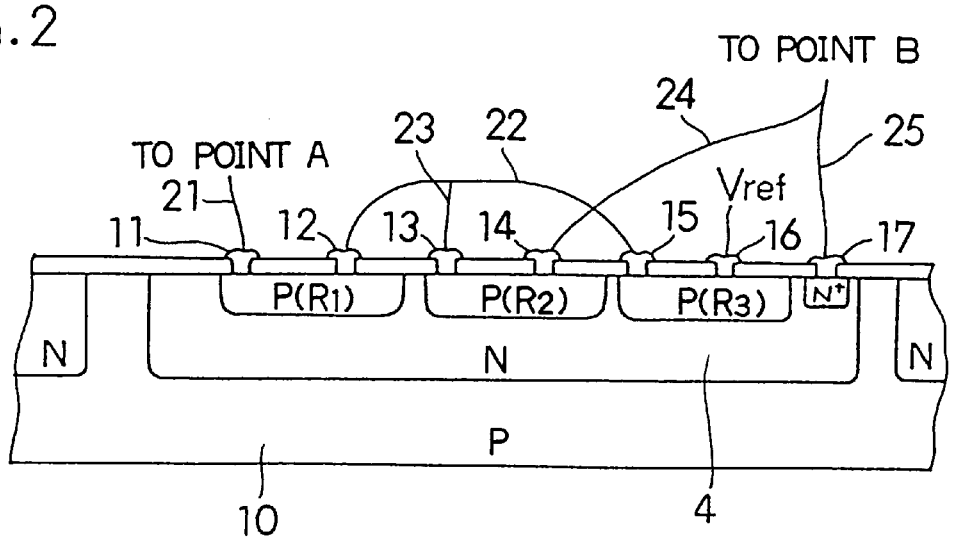
FIG. 2 is a diagram showing a structure of the photoelectric converting device in the first embodiment.

Referring now to the drawings, embodiments of the invention will be described below. FIG. 1 is a drawing showing a circuit configuration of a photoelectric converting device in a first embodiment of the invention. FIG. 2 is a structural diagram of its semiconductor integrated circuit device. In the figures, reference numeral 1 represents an operational amplifier, reference numeral 2 represents a photo diode connection terminal, reference numeral 3 represents an output terminal, and $R_0$, $R_1$, $R_2$, $R_3$ represent resistors, and these resistors are assembled on one semiconductor substrate 10, and specified wiring is formed on the substrate 10, a reference voltage $V_{ref}$ is applied to a non-inverting input terminal (+) of the operational amplifier 1 through resistor $R_0$, the photo diode connection terminal 2 is connected to an inverting input terminal (−), and the output of the operational amplifier 1 is fed back negatively through a feedback resistor $R_k$ formed by star connection of the resistors $R_1$, $R_2$, $R_3$. A photo diode PD as photoelectric converting means is connected to the photo diode connection terminal 2 with the anode side at the reference potential side. Reference numerals 11 to 17 represents contacts, which are made of, for example, aluminum. Reference numerals 21 to 25, 31 and 32 schematically show the wiring.

When light is emitted to the photo diode PD connected to the photo diode connection terminal 2, the photo diode PD generates a current i corresponding to the quantity of light, this current i flows from the output side of the operational amplifier 1 through resistors $R_1$, $R_2$, $R_3$ and a voltage of $V=i\times(R_1\times R_2+R_2\times R_3+R_3\times R_1)/R_3$ is generated between the photo diode connection terminal 2 and output terminal 3. As a result, the output current i of the photo diode PD is converted into a voltage V. The resistors $R_1$, $R_2$, $R_3$ are wired by star connection, and the resistor $R_3$ is connected to the same voltage $V_{ref}$ as the voltage applied to the non-inverting input terminal (+) of the amplifier 1.

As shown in FIG. 2, a common resistor land 4 having the resistors (formed by resistor regions) $R_1$, $R_2$, $R_3$ for composing the feedback resistor $R_k$ is connected to point B which is linked to the output terminal 3. A resistor land 5 having the resistor $R_0$ therein is connected to the reference potential $V_{ref}$, for example, when the operational amplifier 1 is composed as in FIG. 7 described below, or connected to the non-inverting input terminal (+) when the operational amplifier 1 is composed as in FIG. 8 described later, and in this way it is connected to the higher potential side of the resistor $R_0$ determined depending on the transistor of the input stage of the operational amplifier 1. Reference numerals 31, 32 schematically show the wiring.

Figure 3:
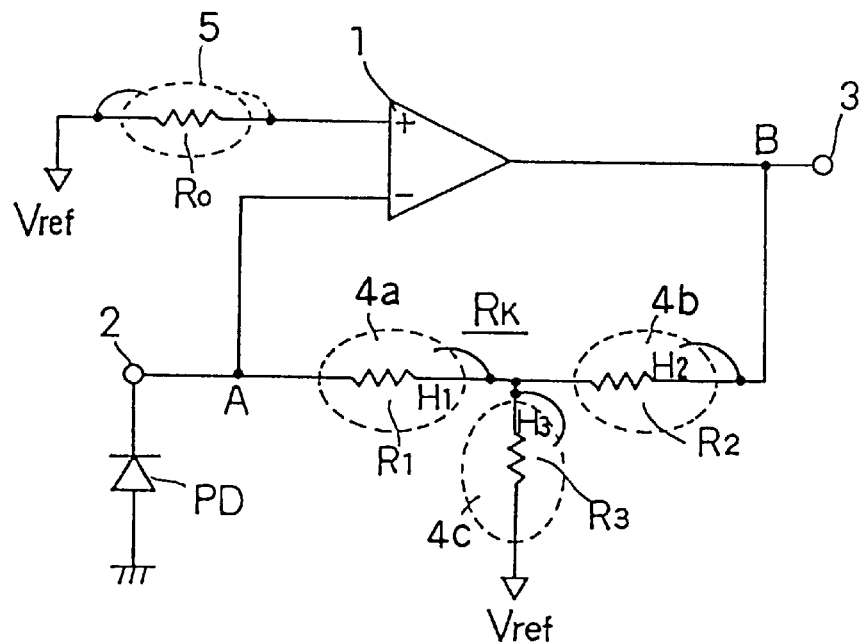
FIG. 3 is a drawing showing a circuit configuration of photoelectric converting device in a second embodiment of the invention.
Figure 4:
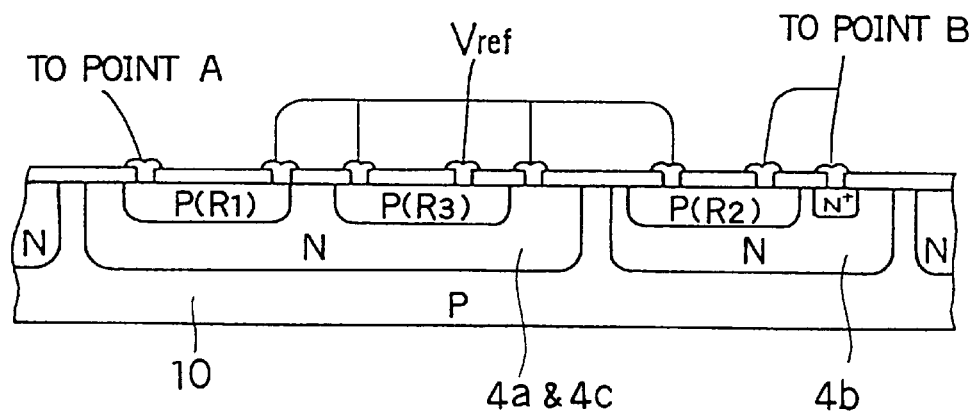
FIG. 4 is a diagram showing a structure of the photoelectric converting device in the second embodiment.

FIG. 3 is a diagram showing a constitution of a photoelectric converting device in a second embodiment of the invention, and as shown in FIG. 4, individual resistor lands 4a, 4b, 4c having the resistors $R_1$, $R_2$, $R_3$ for composing the feedback resistor $R_k$ are connected respectively to the side closer to the output terminal 3 of the resistors $R_1$, $R_2$, $R_3$. In this case, since the resistor $R_1$ and resistor $R_3$ coincide with each other in the side closer to the output terminal 3, the resistor lands 4a, 4c having the resistors $R_1$, $R_3$ can be commonly used. The resistor land 5 having the resistor $R_0$ is same as in the first embodiment shown in FIG. 1.

Figure 5:
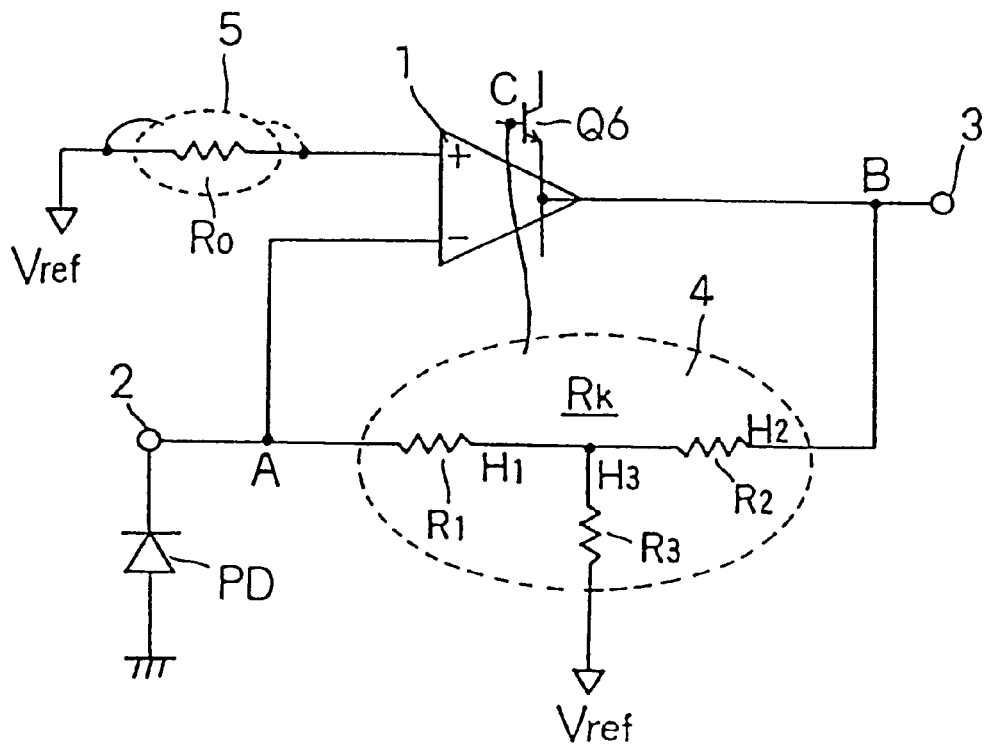
FIG. 5 is a drawing showing a circuit configuration of a photoelectric converting device in a third embodiment of the invention.
Figure 6:
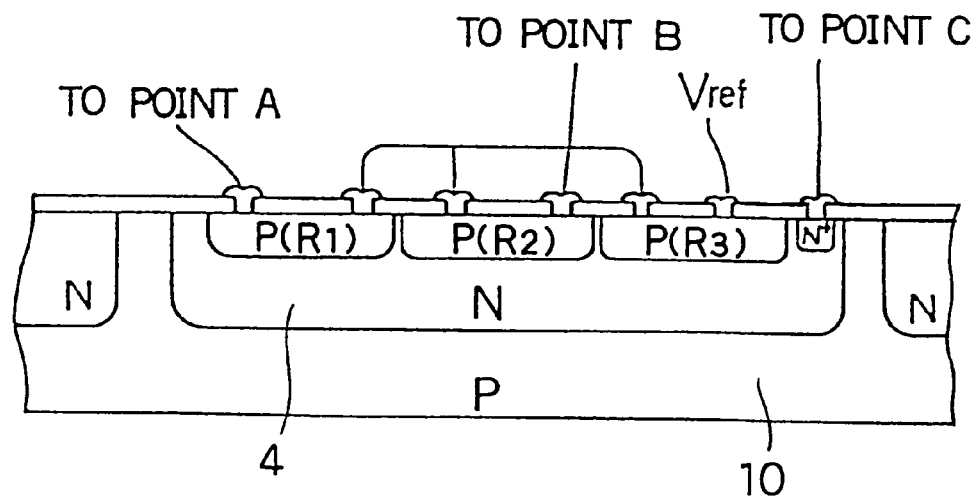
FIG. 6 is a diagram showing a structure of the photoelectric converting device in the third embodiment.

FIG. 5 is a diagram showing a constitution of a photoelectric converting device in a third embodiment of the invention, and as shown in FIG. 6, the common resistor land 4 having the resistors $R_1$, $R_2$, $R_3$ for composing the feedback resistor $R_k$ is connected to the base of a transistor Q6 of the output stage of the operational amplifier 1. The resistor land 5 having the resistor $R_0$ is same as in the first embodiment shown in FIG. 1.

Figure 7:
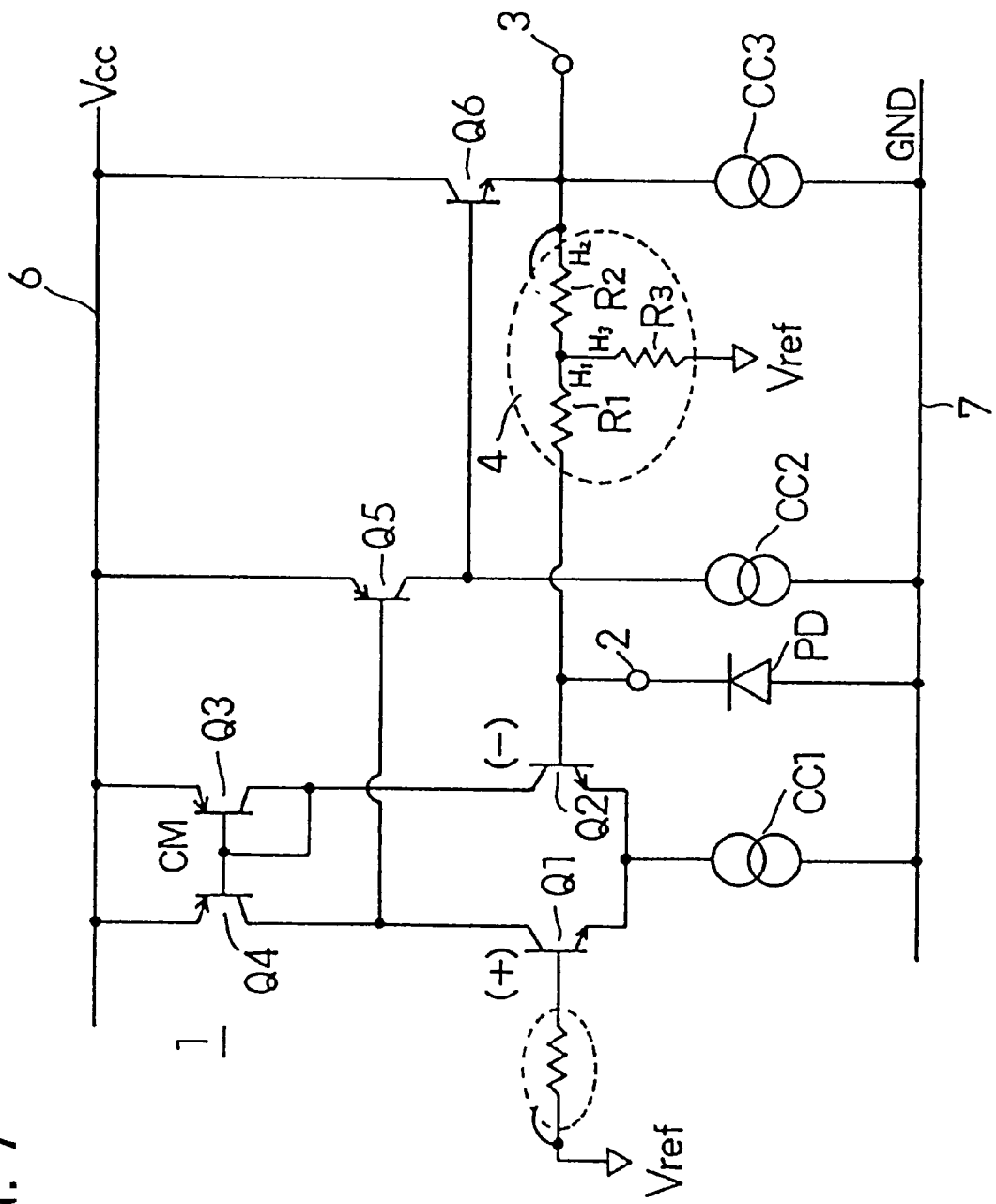
FIG. 7 is a circuit diagram specifically showing the structure of an amplifier used in the embodiments.
Figure 8:
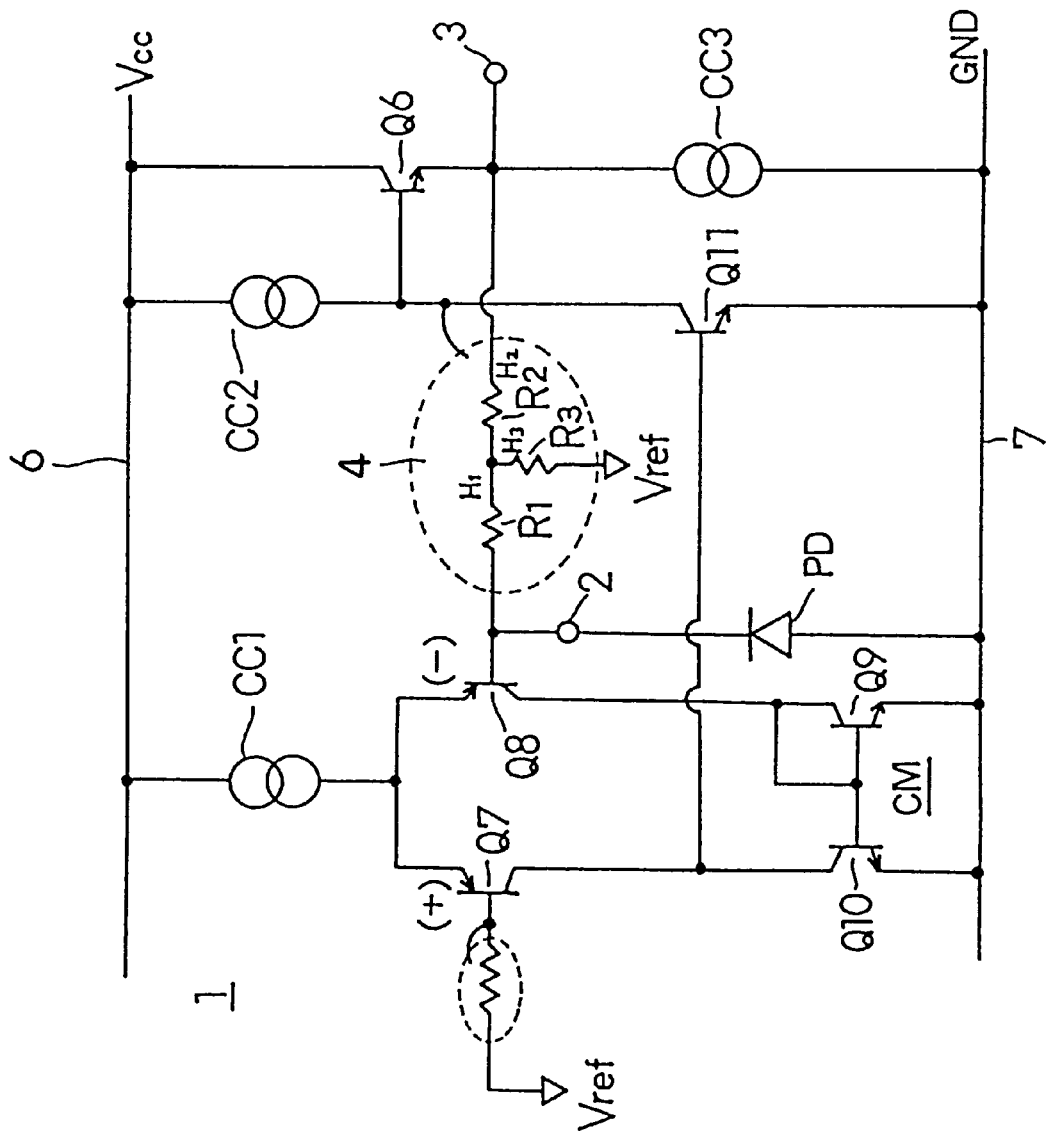
FIG. 8 is a circuit diagram showing other structural example of an amplifier used in the embodiments.

FIG. 7 and FIG. 8 show a specific example of the operational amplifier 1 in the above three embodiments, and also show the connection relation and bias relation of the entire photoelectric converting device in this case. In FIG. 7, the common resistor land 4 having the resistors $R_1$, $R_2$, $R_3$ is connected to the output terminal 3, and the photoelectric converting device of the first embodiment in FIG. 1 is shown, and in FIG. 8, the common resistor land 4 having the resistors $R_1$, $R_2$, $R_3$ is connected to the base of the transistor Q6 at the output stage of the operational amplifier 1, and the photoelectric converting device of the third embodiment in FIG. 5 and FIG. 6 is shown.

In FIG. 7, Q1, Q2, Q6 are NPN type transistors, Q3, Q4, Q5 are PNP type transistors, and CC1, CC2, CC3 are constant current circuits, transistor pairs Q1, Q2 form a differential pair, bases of the transistors Q1, Q2 are respectively non-inverting input terminal (+) and inverting input terminal (−), collectors of the transistors Q1, Q2 are respectively connected to the collector of the transistor Q3 at the input side for forming a current mirror circuit CM, and to the collector of the output side transistor Q4. Emitters of the transistors Q1, Q2 are commonly connected to other end of a constant current circuit CC1 having one end connected to the grounding line 7. The base of the transistor Q5 is connected to the connection point of the collector of the transistor Q1 and the collector of the transistor Q4. The collector of the transistor Q5 is connected to other end of a constant current circuit CC2 having one end connected to the grounding line 7, and the emitter of the transistor Q5 is connected to the power source line 6 of the voltage $V_{cc}$. The transistor Q6 works as an emitter follower. The basis of the transistor Q6 is connected to the connection point of the collector of the transistor Q5 and constant current circuit CC2, and the emitter of the transistor Q6 is connected to other end of a constant current circuit CC3 having one end connected to a grounding line 7. The connection point of the transistor Q6 and constant current circuit CC3 is connected to the output terminal 3.

In this constitution, while current is not flowing in the photo diode PD, the feedback control is applied to keep balance so that the base voltages of the transistors Q1, Q2 may be equal to each other. At this time, all of the transistors Q1, Q2, Q3, Q4, Q5, Q6 are turned on. The voltage of the output terminal 3 is nearly at reference potential $V_{ref}$. In this state, no current flows in the resistors $R_1$, $R_2$, $R_3$.

On the other hand, when current i flows in the photo diode PD, this current i flows in the route of power source line 6, transistor Q6, resistance $R_2$, resistance $R_1$, and photo diode connection terminal 2. Accordingly, the voltage of the output terminal 3 is a positive voltage depending on the current i, that is, $V_{ref}$ +i×R. Here, R=($R_1$×$R_2$ +$R_2$×$R_3$+$R_3$×$R_1$)/$R_3$.

In FIG. 8, instead of the transistors Q1, Q2 forming a differential pair in FIG. 7, PNP type transistors Q7, Q8 are used, and, accordingly, instead of the transistors Q3, Q4 for forming the current mirror circuit CM, NPN type transistors Q9, Q10 are provided, and instead of the transistor Q5, an NPN type transistor Q11 is provided, and what is connected to the power source line 6 in FIG. 7 (CM) are connected to the grounding line 7, and what are connected to the grounding line 7 is in FIG. 7 (CC1 and CC2) are connected to the power source line 6, and the operation is substantially same as shown in FIG. 7, and hence explanation is omitted.

In the photoelectric converting device, supposing the potential of the non-inverting input terminal (+) of the operational amplifier 1 to be $V_A$, the voltage of the inverting input terminal (−) to be $V_B$, the voltages of the closer side ($H_1$, $H_2$, $H_3$) to the output terminal 3 of the resistors $R_1$, $R_2$, $R_3$ to be respectively $V_C$, $V_D$, $V_E$, and the voltage of the output terminal 3 to be $V_{OUT}$, while no current is flowing in the photo diode PD, the relation is $V_A=V_B=V_C=V_D=V_E=V_{OUT}$, and while current is flowing in the photo diode PD, the relation is $V_B<V_C=V_E<V_D=V_{OUT}$, and therefore the voltage of the output terminal 3 is always higher than the voltages applied to the resistors $R_1$, $R_2$, $R_3$. The base voltage of the transistor Q6 of the output stage of the operational amplifier 1 is always higher than the voltage of the output terminal 3 by a specific voltage, that is, always higher than the voltages applied to the resistors $R_1$, $R_2$, $R_3$. Therefore, as the voltage for connecting the resistor land, it is enough to satisfy the condition that it should be higher than the voltages applied to the connected resistors, and there is no problem if the resistor land is connected as shown in the three embodiments above, and by connecting in such manner, moreover, ripple due to fluctuation of supply voltage $V_{cc}$ of the power source line is not generated in the voltage connected to the resistor land, and hence mixture of power source ripple in the output of the photoelectric converting device can be prevented.

In these three embodiments, the feedback resistor $R_k$ is formed by star connection of three resistors $R_1$, $R_2$, $R_3$, but the invention is not limited to this alone, and, for example, the feedback resistor $R_k$ may be formed of one resistor or plural resistors connected in series.

As explained herein, according to the photoelectric converting device of the invention, ripple due to fluctuation of supply voltage is not generated in the voltage connected to the resistor land having the feedback resistor, and mixture of power source ripple into the output of the photoelectric converting device can be prevented.

What is claimed is:

1. A photoelectric converting device comprising:
   an amplifier,
   photoelectric converting means connected between an input terminal of the amplifier and a grounding voltage point,
   a feedback resistor connected between the input terminal and an output terminal of the amplifier through which the current of photoelectric converting means flows, this feedback resistor being formed by P-type resistor region provided in an N-type resistor land of a semiconductor substrate, and
   means for connecting the resistor land to an output terminal of the amplifier in order to apply an inverse bias to the PN junction between the resistor land and resistor region.

2. A photoelectric converting device comprising:

an amplifier, a photo diode of which cathode is connected to an input terminal of the amplifier, and anode is connected to a grounding voltage point, a feedback resistor connected between the input terminal of the amplifier and an output terminal of the amplifier through which the current of photo diode flows, this feedback resistor being formed by P-type resistor region provided in an N-type resistor land of a semiconductor substrate, and means for connecting the resistor land to an output terminal of the amplifier in order to apply an inverse bias to a PN junction between the resistor land and resistor region.

3. A photoelectric converting device comprising:

an operational amplifier, means for applying a reference voltage to a non-inverting input terminal of the operational amplifier, photoelectric converting means connected between an inverting input terminal of the operational amplifier and a grounding voltage point, a feedback resistor connected between the inverting input terminal of the operational amplifier and the output terminal of the operational amplifier through which the current of photoelectric converting means flows, this feedback resistor being formed by P-type resistor region provided in an N-type resistor land of a semiconductor substrate, and means for connecting the resistor land to the output terminal of the amplifier in order to apply an inverse bias to the PN junction between the resistor land and the resistor region.

4. A photoelectric converting device of claim 3, wherein the feedback resistor is composed of three resistors formed by star connection, a first terminal thereof is connected to the inverting input terminal of the operational amplifier, a second terminal thereof is connected to the output terminal of the operational amplifier, and a third terminal thereof is connected to a same voltage as the reference voltage given to the non-inverting input terminal of the amplifier.

5. A photoelectric converting device according to claim 3, wherein the feedback resistor is composed of a first resistor having one end connected to the inverting input terminal of the operation amplifier, a second resistor having one end connected to another end of the first resistor and having another end connected to the output terminal of the amplifier and a third resistor having one end connected to the another ends of the first and second resistors and having another end connected to a same voltage as the reference voltage given to the non-inverting input terminal of the amplifier, wherein the first and third resistor is formed in a first resistor land of a semiconductor substrate and the second resistor is formed in a second resistor land of the semiconductor substrate, wherein the first resistor land is connected to the another end of the second resistor while the second resistor land is connected to the output terminal of the amplifier.

6. A photoelectric converting device comprising:

a differential amplifier including first and second transistors of which emitters are commonly connected a constant current circuit, means for applying a predetermined DC voltage to a base of the first transistor, photoelectric converting means connected between a base of the second transistor and a grounding voltage point, an emitter follower transistor for receiving an output of the first transistor by its base, an output terminal connected to an emitter of the emitter follower transistor, a feedback resistor connected between an output terminal of the photoelectric converting device and a base of the second transistor through which the current of photoelectric converting means flows, this feedback resistor being formed by P-type resistor region provided in an N-type resistor land of a semiconductor substrate, and means for connecting the resistor land to the base of the emitter follower transistor.

\* \* \* \* \*